(12) United States Patent
Choe et al.

(10) Patent No.: US 10,644,659 B2
(45) Date of Patent: May 5, 2020

(54) VOLTAGE BUFFER FOR INPUT VOLTAGES ABOVE A SUPPLY VOLTAGE OR BELOW GROUND VOLTAGE

(71) Applicant: Allegro MicroSystems, LLC, Manchester, NH (US)

(72) Inventors: Soo-Chang Choe, Andover, MA (US); Craig S. Petrie, Merrimack, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 90 days.

(21) Appl. No.: 16/111,679

(22) Filed: Aug. 24, 2018

(65) Prior Publication Data
US 2020/0067467 A1  Feb. 27, 2020

(51) Int. Cl.
| H03F 3/16 | (2006.01) |
| H03F 3/45 | (2006.01) |
| G01R 19/25 | (2006.01) |

(52) U.S. Cl.
CPC .......... *H03F 3/16* (2013.01); *G01R 19/2513* (2013.01); *H03F 3/45183* (2013.01); *H03F 2200/151* (2013.01); *H03F 2200/219* (2013.01); *H03F 2200/69* (2013.01); *H03F 2203/45006* (2013.01); *H03F 2203/45144* (2013.01)

(58) Field of Classification Search
None
See application file for complete search history.

(56) References Cited

U.S. PATENT DOCUMENTS

| 5,345,191 A * | 9/1994 | Tanaka ................... H03F 1/483 330/277 |
| 5,365,199 A * | 11/1994 | Brooks ................... H03F 1/301 330/291 |
| 5,699,012 A * | 12/1997 | Hakkarainen ....... H03F 3/45479 330/69 |
| 7,075,287 B1 | 7/2006 | Mangtani et al. |
| 7,476,816 B2 | 1/2009 | Doogue et al. |
| 2010/0026359 A1 * | 2/2010 | Kapusta, Jr. ....... H03K 19/0185 327/309 |

OTHER PUBLICATIONS

U.S. Appl. No. 16/013,330, filed Jun. 20, 2018, El Bacha, et al.

* cited by examiner

*Primary Examiner* — Jas A Sanghera
(74) *Attorney, Agent, or Firm* — Daly, Crowley, Mofford & Durkee LLP

(57) ABSTRACT

A buffer amplifier comprises a source follower and a feedback amplifier. The feedback amplifier may be configured to control a drain current of the source follower to remain substantially constant independent of a load.

37 Claims, 7 Drawing Sheets

VOLTAGE BUFFER FOR INPUT VOLTAGES ABOVE A SUPPLY VOLTAGE OR BELOW GROUND VOLTAGE

BACKGROUND

In the field of power monitoring, many power monitoring sensors are required to sense an input voltage that is greater than or very close to the supply voltage for the power monitoring sensors. This arrangement requires relatively low output impedances and relatively high input impedances for the power monitoring sensor circuits.

SUMMARY

Embodiments provide apparatuses for voltage buffers for input voltages above a supply voltage. In embodiments, a buffer amplifier comprises a source follower and a feedback amplifier. The feedback amplifier may be configured to control a drain current of the source follower to remain substantially constant independent of a load.

Through this, a voltage buffer for input voltages above a supply voltage or below ground voltage is achieved. By controlling the drain current of the source follower, this allows for the impedances presented at the input and output of the buffer amplifier to be adjusted in order to eliminate error.

The buffer amplifier may further include one or more of the following features either alone or in combination: The feedback amplifier may control a voltage of a drain of the source follower. The controlled voltage of the drain of the source follower can be approximately within 300 mV of a supply voltage.

In embodiments, the buffer amplifier can be coupled to an input voltage derived from a line voltage and also to a supply voltage derived from the line voltage. Further, a common mode voltage associated with the line voltage can be greater than the supply voltage or within approximately 300 mV of the supply voltage.

In embodiments, the buffer amplifier may also include an attenuator coupled to an input of the buffer amplifier. The attenuator can include at least one resistor. Also, an input impedance presented by the buffer amplifier is effectively 1000 times greater than an output impedance presented by the attenuator.

Further, an output of the source follower can be coupled to a variable gain amplifier. An impedance presented at an input of the variable gain amplifier may be effectively 1000 times greater than an output impedance presented at the buffer amplifier. In embodiments, the buffer amplifier can be realized in an integrated circuit.

In embodiments, the feedback amplifier comprises a MOSFET coupled to a source of the source follower of the buffer amplifier. The MOSFET can be configured to control the drain current of the source follower. The buffer amplifier can also include a capacitor coupled between the drain of the source follower and a gate of the MOSFET where the capacitor is configured to control a frequency response of the buffer amplifier.

The feedback amplifier can include at least two source followers. A gate of a first source follower of the feedback amplifier can be coupled to a reference voltage and a gate of a second source follower of the feedback amplifier can be coupled to a drain voltage of the source follower of the buffer amplifier. The drain voltage can be within approximately 100 mV of the reference voltage. The first and second source followers of the feedback amplifier can be coupled to a differential amplifier with the first and second source followers of the feedback amplifier able to be configured to shift at least one voltage of a differential pair at an input of the differential amplifier.

With described arrangements, a voltage buffer sustainable for providing input voltages close to or greater than a supply voltage is provided with relatively low output impedance. The voltage buffer allows for reduced error at its input by reducing input offset and reduced gain error by providing a relatively low output impedance. This arrangement is advantageous as compared to the use of a typical source follower circuit for this function. Additionally, a typical output impedance of a source follower circuit can cause a gain error.

In another embodiment, a power monitoring circuit to monitor a line voltage associated with a power source comprises a buffer amplifier comprising a source follower and a feedback amplifier. The feedback amplifier may be configured to control a drain current of the source follower to remain substantially constant independent of a load.

The power monitoring circuit may also include one or more of the following features taken either alone or in combination: The buffer amplifier can be coupled to an input voltage based on the line voltage and to a supply voltage derived from the line voltage. In embodiments, a common mode voltage associated with the line voltage can be greater than the supply voltage or within approximately 300 mV of the supply voltage.

In embodiments, the supply voltage can be an AC voltage or DC voltage. In embodiments, an input impedance of the buffer amplifier can be effectively greater than 100 MOhms and an output impedance of the buffer amplifier can be effectively less than 100Ω.

In embodiments, the power monitoring circuit can also include a variable gain amplifier coupled to an output of the buffer amplifier. An output of the variable gain amplifier can be coupled to an analog-to-digital converter which can include a sigma-delta modulator. An output of the analog-to-digital converter may further be coupled to a digital signal processor that can include a demodulation chopper circuit synchronized with a modulation chopper circuit at an input of the buffer amplifier. The power monitoring circuit can be realized in an integrated circuit.

In yet another embodiment, an apparatus comprises means for controlling a drain current of a source follower in a buffer amplifier to remain substantially constant independent of a load; and means for controlling an output impedance of the buffer amplifier.

The apparatus may also include means for controlling the drain current of the source follower to match a drain current of at least one of a plurality of MOSFETs in the buffer amplifier; means for controlling a voltage at a drain of the source follower; means for shifting an output voltage of the buffer amplifier; means for controlling a capacitance of the source follower.

BRIEF DESCRIPTION OF THE DRAWINGS

The concepts, structures, and techniques sought to be protected herein may be more fully understood from the following detailed description of the drawings, in which.

Figure 1A:
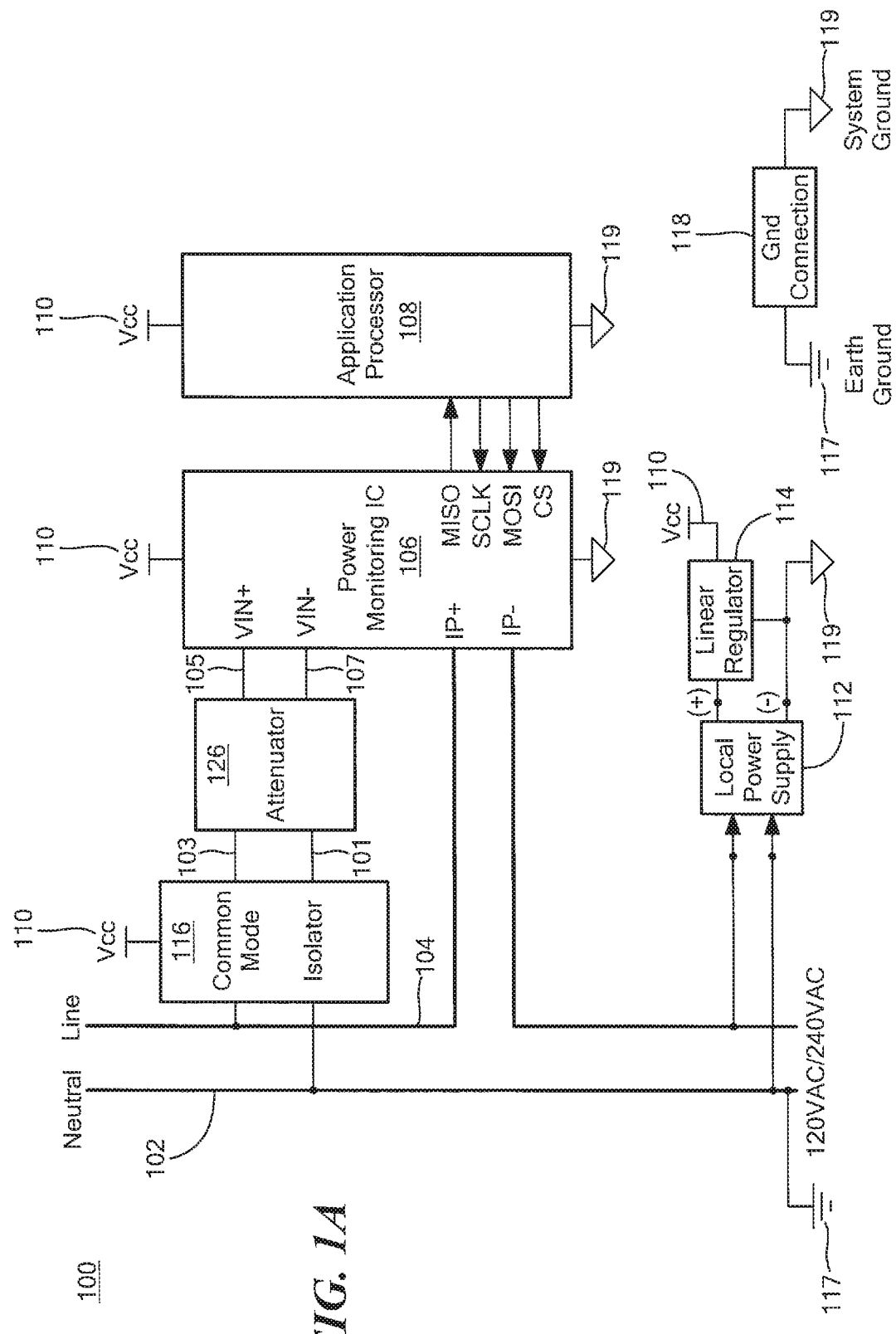
FIG. 1A is a block diagram of a power monitoring circuit including a source follower buffer amplifier when a common mode voltage is close to a supply voltage, according to some embodiments.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses one or more magnetic field sensing elements, generally in combination with other circuits. The magnetic field sensor can be, for example, a rotation detector, a movement detector, a current sensor, or a proximity detector.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1B:
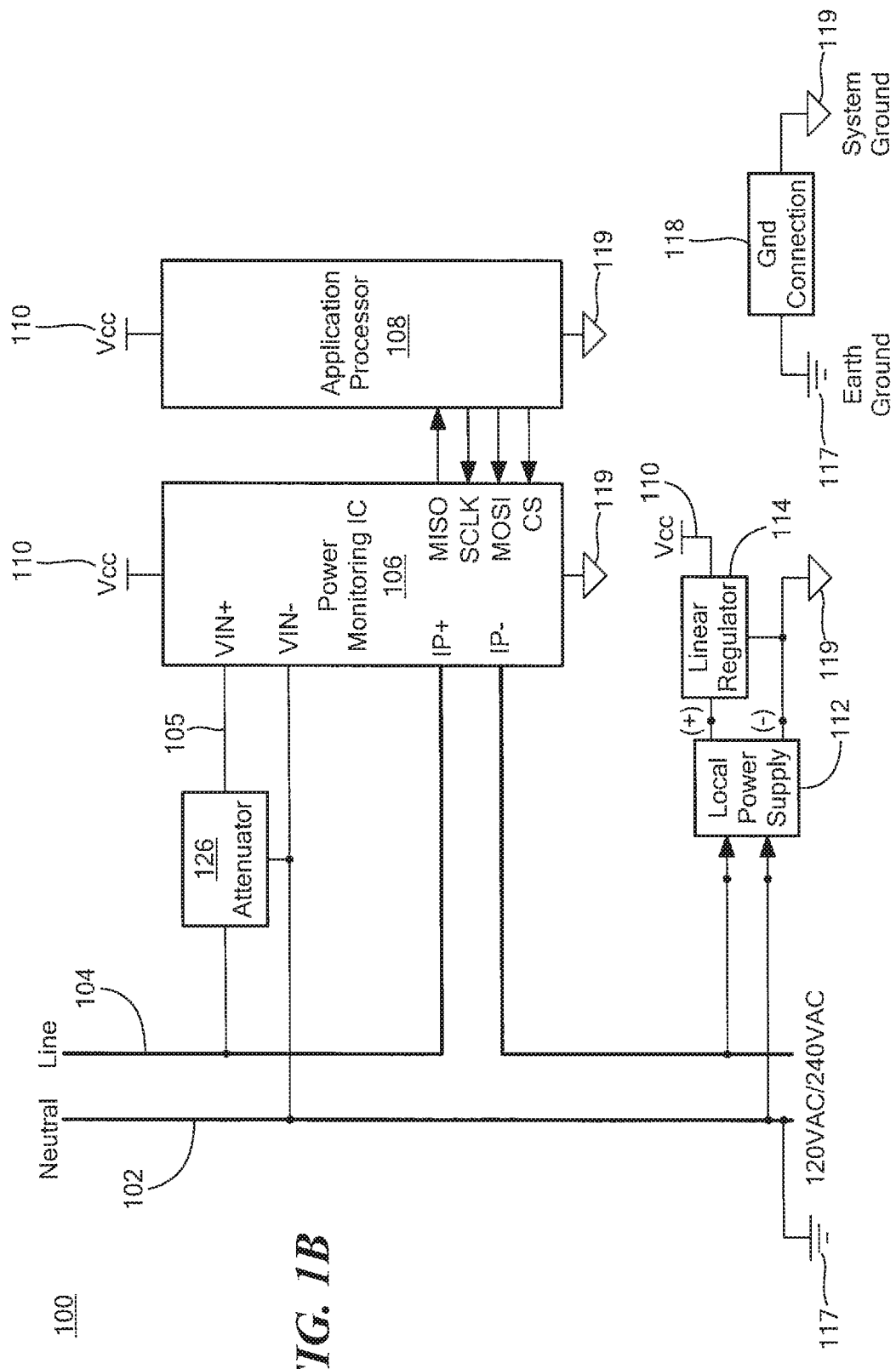
FIG. 1B is a block diagram of a power monitoring circuit including a source follower buffer amplifier when a common mode voltage is close to a system ground, according to some embodiments.

Referring now to FIGS. 1A and 1B, power monitoring system 100 includes a power monitor integrated circuit ("IC") 106 coupled to neutral voltage 102 and line voltage 104 via common mode isolator 116, attenuator 126, or both. Power monitoring IC 106 comprises analog circuits, digital circuits, sensors (such as temperature sensors, Hall sensor arrays, or any combination thereof) configured to monitor the power input or output of AC and DC powered devices.

According to some embodiments, power monitoring IC 106 may include a plurality of pins comprising at least one input voltage pin (VIN+), at least one reverse input voltage pin (VIN−), at least one positive current sense pin (IP+), at least one negative current sense pin (IP−), at least one serial bus (e.g. an i²C bus, serial peripheral interface bus (SPI), or any combination thereof—to name a few examples), or any combination thereof. In the illustrative embodiment of FIG. 1, power monitoring IC 106 comprises the pins VIN+, VIN−, IP+, IP−, and an SPI bus (comprising pins MISO, SCLK, MOSI, and CS).

In some embodiments, power monitoring IC 106 is configured to monitor power from at least one of line voltage 104 or neutral voltage 102. Line voltage 104 may comprise the output of a DC or AC power supply such as a wall outlet, voltage regulator, invertor, rectifier, transformer, or any combination thereof—to name a few examples. In the illustrative embodiments of FIGS. 1A and B, line voltage 104 comprises the output of an AC or DC power supply and neutral voltage 102 comprises the neutral-to-ground related to line voltage 104.

In the illustrative embodiment of FIGS. 1A and 1B, power monitoring IC 106 is coupled to a supply voltage ($V_{cc}$) 110 generated by linear regulator 114. Linear regulator 114 is configured to output a constant voltage, such as $V_{cc}$ 110 and may include an IC, solid-state components, vacuum tube components, or any combination thereof—to name a few examples. Linear regulator 114 is powered by local power supply 112 (i.e. an output of local power supply 112 powers linear regulator 114). Local power supply 112 may include a single output isolated power supply such as a transformer, flyback converter, rectifier, boost converter, buck converter, boost-buck converter, or any combination thereof—to name a few examples. According to some embodiments, line voltage 104 and neutral voltage 102 may be connected to an input of local power supply 112 with local power supply 112 configured to generate an output voltage based upon line voltage 104 and neutral voltage 102.

Line voltage 104 and neutral voltage 102 are provided as a differential pair to power monitoring IC 106 to allow power monitoring IC 106 to monitor power from at least one of line voltage 104 or neutral voltage 102. According to some embodiments, line voltage 104 and neutral voltage 102 are each provided to power monitoring IC 106 via common mode isolator 116, attenuator 126, or both. Power monitoring system 100 may be configured to allow for the common mode voltage related to the differential pair of line voltage 104 and neutral voltage 102 to be close to supply voltage $V_{cc}$ 110 without interfering with the operation of power monitoring system 100 while in other embodiments, power monitoring system 100 may be configured to allow for the common mode voltage to be close to system ground 119 without interfering with the operation of power monitoring system 100.

System ground 119 represents the ground, or neutral, voltage for power monitoring system 100. System ground 119 is coupled to ground connection 118 which is configured to coupled system ground 119 to earth ground 117. Ground connection 118 may include an off-site power ground on-site power ground local power ground or any combination thereof and is configured to deliver AC or DC power.

The illustrative embodiment of FIG. 1A presents a configuration for power monitoring system 100 allowing for the common mode voltage related to the differential pair of line voltage 104 and neutral voltage 102 to be at a voltage level close to the voltage level of supply voltage $V_{cc}$ 110. For example, when the common mode voltage is within 300 mV of supply voltage $V_{cc}$ 110. In the illustrative embodiment of FIG. 1A, line voltage 104 and neutral voltage 102 are provided to common mode isolator 116. Common mode isolator 116 is configured to isolate the common mode voltage from the differential pair to generate an isolated differential voltage pair (i.e. an isolated line voltage 103 and an isolated neutral voltage 101). In some embodiments, common mode isolator 116 may further be coupled to $V_{cc}$ 110 and may be configured to generate the isolated differential pair based upon $V_{cc}$ 110. For example, common mode isolator 116 may be configured to bring the common mode voltage of the isolated differential pair close to $V_{cc}$ 110. Common mode isolator 116 may include, for example, a flyback converter, a transformer, induction elements, or any combination thereof, to name a few.

According to some embodiments, common mode isolator 116 may be configured to provide the isolated differential voltage pair to attenuator 126. Attenuator 126 includes one or more resistive elements (such as a resistor network), capacitive elements, inductive elements, switches—or any combination thereof—arranged in series, parallel or any combination thereof. Attenuator 126 is configured to attenuate, or apply a loss to, the isolated differential voltage pair to generate an attenuated differential pair (attenuated line voltage 105 and attenuated neutral voltage 107). In some embodiments, attenuator 126 may be configured to supply to attenuated line voltage 105 to at least one voltage pin (VIN+) of power monitoring IC 106 and supply attenuated neutral voltage 107 to at least one reverse voltage pin (VIN−) of power monitoring IC 106.

As discussed above, common mode isolator 116 may be configured to bring the common mode voltage of the isolated differential pair close to $V_{cc}$ 110 (and thus the attenuated differential pair) which allows attenuated line voltage 105 to be close to $V_{cc}$ 110 (such as, for example, within 300 mV of $V_{cc}$ 110).

Referring now to FIG. 1B, a configuration for power monitoring system 100 when the common mode voltage related to the differential pair of line voltage 104 and neutral voltage 102 is at a voltage level close to system ground 119 is presented. For example, when the common mode voltage is within 300 mV of system ground 119. In the configuration of FIG. 1B, line voltage 104 is provided to attenuator 126. Attenuator 126 is configured to attenuate, or provide a loss to, line voltage 104 and generate attenuated line voltage 105. Attenuated line voltage 105 is provided to at least one voltage pin (VIN+) of power monitoring IC 106. Further, in the configuration of FIG. 1B, neutral voltage 102 is supplied directly to at least one reverse voltage pin (VIN−) of power monitoring IC 106. Such a configuration allows for attenuated line voltage 105 to be close to system ground 119 without interfering with the operation of power monitoring IC 106. For example, attenuated line voltage 104 may be within 300 mV of system ground 119.

To monitor the power from line voltage 104 or neutral voltage 102, power monitoring IC 106 is placed in line or in series with line voltage 104, in other words, line voltage 104 is connected at a first pin (such as one IP+ or IP− pin) of power monitoring IC 106 and continues at a second pin (such as one other IP+ or IP− pin) of power monitoring IC 106. For example, in the illustrative embodiments of FIGS. 1A and B, line voltage 104 is connected at the IP+ pin of power monitoring IC 106 and continues at the IP− pin.

According to an embodiment, power monitoring IC 106 may monitor the power from line voltage 104 via a magnetic field sensor comprising one or more magnetic field sensing elements. Because power monitoring IC 106 is in line with line voltage 104, the current from line voltage 104 flows through a conductor from the IP+ to the IP− pins of the of power monitoring IC 106. A magnetic field generated by the line current can be detected by the magnetic field sensing elements. The magnetic field sensing elements generate a magnetic field signal representative of the detected magnetic field and thus, representative of the line current.

According to some embodiments, power monitoring IC 106 may include at least one analog to digital converter to generate a digital signal representative of the magnetic field signal. The digital signal may be provided to a digital signal processor ("DSP") (comprising a processor, a computer, a microprocessor, digital logic, or any combination thereof—to name a few examples) configured to generate parameter signals representative of power parameters of line voltage 104. These power parameters may comprise instantaneous voltage, instantaneous current, RMS voltage, RMS current, active power, apparent power, reactive power, power factor, lag, overcurrent fault, averaging over time, over/undervoltage detection, or any combination thereof—to name a few. The parameter signals may be provided to application processor 108 via the serial bus of power monitoring IC 106. For example, in the illustrative embodiment of FIG. 1, the parameter signals may be provided to application processor 108 via the SPI bus of power monitoring IC 106.

According to some embodiments, power monitoring system 100 includes application processor 108. Application processor 108 comprises a DSP (comprising a processor, a computer, a microprocessor, digital logic, or any combination thereof—to name a few examples) configured to display and store the power parameters of line voltage 104. According to some embodiments, application processor 108 may be powered by a supply voltage $V_{cc}$ 110.

In some embodiments, the input impedance presented at pins VIN+ and VIN− may be much higher than that of the output impedance presented by attenuator 126 in order to reduce input error, as discussed in further detail with reference to FIG. 2.

Figure 1C:
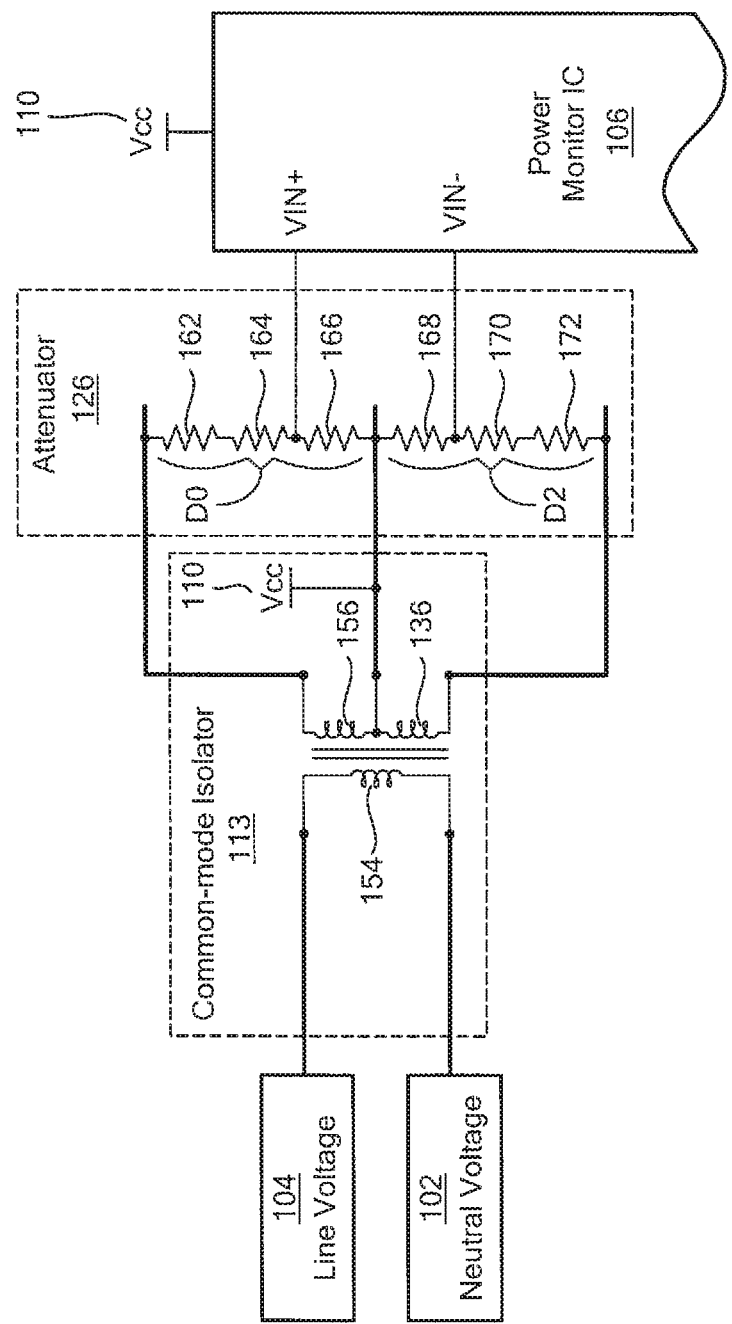
FIG. 1C is a schematic diagram of a common-mode isolator coupled to an attenuator, according to embodiments.

Referring now to FIG. 1C, an example common-mode isolator 113 coupled to an example attenuator 126 is provided. Common-mode isolator 113 can include a first inductive coil 154 having a first number of windings (e.g. M windings), a second inductive coil 156 having a second number of windings (e.g. having L windings), and magnetic core 158 configured as a transformer. The first inductive coil 154 is coupled to a differential pair with the first inductive coil 154 being coupled, at a first end, to line voltage 104 and, at a second end, to neutral voltage 102. In embodiments, both the first and second inductive coils 154, 156 can comprise one or more inductive coils each having a respective number of windings.

Common-mode isolator 113 is coupled to attenuator 126. Attenuator 126 includes voltage divider D0 (including resistors 162, 164, 166) and voltage divider D2 (including resistors 168, 170, 172). Each voltage divider is coupled to the second inductive coil 156 between a first predetermined number of windings of the second inductive coil 156 and a second predetermined number of windings of the second inductive coil 156. For example, voltage divider D0 can be coupled to the second inductive coil 156 at 0 windings (a first predetermined number of windings) and at M/2 windings (a second predetermined number of windings).

Voltage dividers D0 and D2 are each configured to output voltages VIN+ and VIN−, respectfully, based upon the values of its resistors, the differential pair, and the number of windings at which the voltage divider is coupled to the second inductive coil 156. For example, voltage divider D0 is configured to output voltage VIN+ based upon the values of resistors 162, 164, 166, the differential pair, and the number of windings at which voltage divider D0 is coupled to the second inductive coil 156. In embodiments, voltages VIN+ and VIN− are representative of an isolated differential pair. In embodiments, voltage VIN+, output by voltage divider D0, is provided to at least one VIN+ pin of power monitoring IC 106 and voltage VIN−, output by voltage divider D2, is provided to at least one VIN− pin of power monitoring IC 106.

In embodiments, voltage dividers D0 and D2 can also be coupled to $V_{cc}$ 110. In such a configuration, the output voltages VIN+, VIN− of the voltage dividers are based upon $V_{CC}$ 110 as well as the values of its respective resistors, the differential pair, and the number of windings at which the voltage divider are coupled to the second inductive coil 156.

Figure 2:
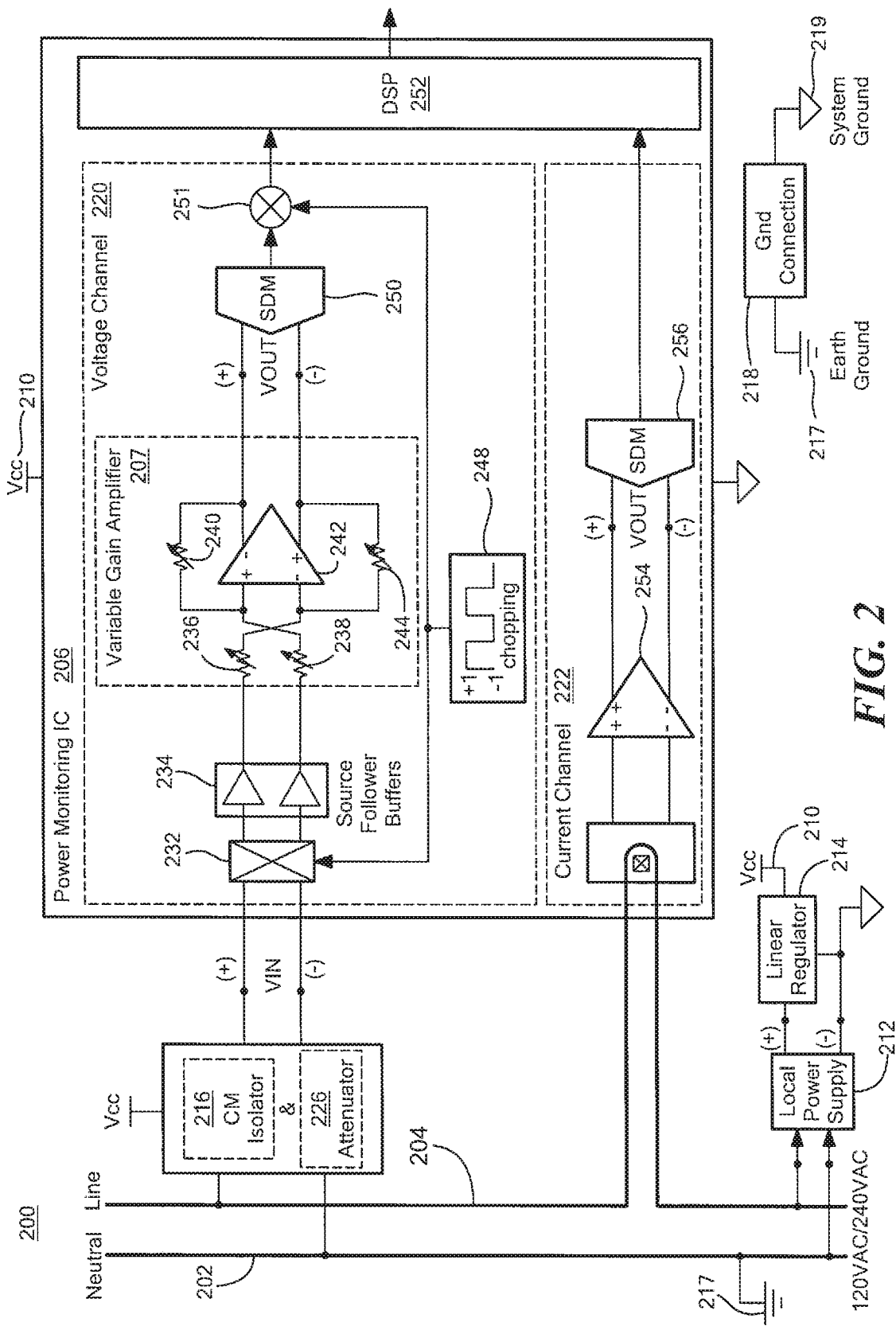
FIG. 2 is a block diagram of a power monitoring system, according to some embodiments.

Referring now to FIG. 2, a power monitoring system 200 may be the same as or similar to system 100 of FIG. 1. System 200 includes a power monitoring IC 206 which includes voltage channel 220 and current channel 222. Voltage channel 220 and current channel 222 are also each coupled to DSP 252. Voltage channel 220 includes chopping modulator 232, source follower buffers 234, variable gain amplifier 207, an analog-to-digital converter (represented here as sigma-delta modulator ("SDM") 250), chopping demodulator 251, or any combination thereof and current channel 222 includes differential amplifier 254, an analog-to-digital converter (represented here as SDM 256), or any combination thereof. Voltage channel 220 is configured to monitor the voltage of line voltage 204, neutral voltage 202, or both.

Voltage channel 220 is configured to amplify a voltage input signal with a programmable gain provided by at least one source follower buffer (represented here as source follower buffers 234). Voltage channel is coupled to line voltage 204 and neutral voltage 202 via common-mode isolator 216, attenuator 226, or both. According to some embodiments, line voltage 204 and neutral voltage 202 are coupled to an input of common-mode isolator 216 which in turn provides an isolated line voltage and isolated neutral voltage to attenuator 226, while in other embodiments line voltage 204 and neutral voltage 202 are coupled directly to attenuator 226. Common mode isolator 216 is configured to bring the common mode voltage of line voltage 104 and neutral voltage 102 close to $V_{cc}$ 210 before line voltage 104 and neutral voltage 102 are provided to attenuator 226.

Attenuator 226 is configured to provide the attenuated line voltage and attenuated neutral voltage to voltage channel 220. For example, attenuator 226 may comprise a voltage-divider circuit and that is configured to adjust the input voltage seen by voltage channel 220. Voltage channel 220 is further coupled to supply voltage $V_{cc}$ 210 or system ground 219 as generated by linear regulator 214 (as discussed above with reference to linear regulator 114 in the illustrative embodiments of FIGS. 1A and B). Linear regulator 214 is powered by local power supply 212 which is in turn powered by line voltage 204 and neutral voltage 202 as discussed above with reference to FIGS. 1A and B.

At an input of voltage channel 220, the input voltage ("VIN") is provided. Input voltage VIN is based upon $V_{cc}$ 210 or system ground 219 and the attenuated voltages generated by attenuator 216 as depicted in the illustrative embodiment of FIG. 2. In other words, VIN includes the attenuated line voltage and the attenuated neutral voltage. According to some embodiments, the input of voltage channel 220 may be coupled to chopping modulator 232 in order to modulate the input voltage VIN before it is provided source follower buffer amplifiers 234. Likewise, at the output of voltage channel 220 may be coupled to chopping demodulator 251 to demodulate the output signal before it is provided to DSP 252.

A clock generator 248 can provide a clock signal to chopping modulator 232 and to chopping demodulator 251 in order to thereby remove or reduce offset effects inherent in the voltage amplifier. Chopping modulator 232 may be implemented with bootstrapped switching because, in some embodiments, VIN may be greater in value than (i.e. go higher than) $V_{cc}$ 210.

Each source follower buffer amplifier 234 includes at least one source follower and at least one feedback amplifier and is configured so that the common-mode voltage of the voltage at the input of voltage channel 220 (VIN) can be set close to $V_{cc}$ 210 or system ground 219 by CM isolator 216 and/or attenuator 226 before being provided to variable gain amplifier 207. Each source follower buffer amplifier 234 is further configured to drive the impedance presented at the input of gain amplifier 207 (represented here as variable resistors 236 and 238). In other words, the impedance presented at the input of variable gain amplifier 207 is based upon the configuration of source follower buffer amplifiers 234. Source follower buffer amplifiers 234 may each comprise at least one MOSFET and at least one feedback amplifier with each feedback amplifier including at least one MOSFET and at least one current source (described in further detail with reference to FIGS. 3A and B). According to some embodiments, each source follower buffer amplifier 234 may be configured to generate an amplified input voltage that includes an amplified line voltage and an amplified neutral voltage. In some embodiments, each source follower buffer amplifier may provide a gain between 0.6 to 1 to an input voltage VIN of voltage channel 220, while in other embodiments, each source follower buffer amplifier 234 may be configured to provide a gain between 0.5 to 2 to an input voltage VIN of voltage channel 220.

Source follower buffer amplifiers 234 are configured so that the input impedance presented to the input voltage VIN at source follower buffers 234 is based upon the output impedance presented by attenuator 226. According to some embodiments, source follower buffer amplifiers 234 are configured to present an input impedance that is effectively many times greater than the output impedance presented by attenuator 226. For example, in some embodiments, source follower buffer amplifiers 234 may be configured to present an input impedance that is effectively 1000 or more times greater than the output impedance presented by attenuator 226. In some embodiments, the input impedance presented by source follower buffer amplifiers 234 is approximately 100MΩ.

The amplified voltage generated by source follower buffers 234 is provided to an input of variable gain amplifier 207. Variable gain amplifier 207 includes input resistors 236 and 238, feedback resistors 240 and 244, and operational amplifier 242 configured as a differential amplifier. According to some embodiments, the amplified input voltage generated by source follower buffers 234 may be coupled to input resistors 236 and 238. The amplified line voltage generated by source follower buffers 234 is provided to a first input voltage of the differential amplifier and the amplified neutral voltage is suppled to a second input voltage of the differential amplifier.

According to some embodiments, resistors 236, 238, 240, 244 may include programmable resistors configured to each have programmable impedances. One of skill in the art will appreciate that a desired gain for source follower buffer amplifiers 234 may be achieved by adjusting each programmable impedance of resistors 236, 238, 240, 244 to the impedances necessary for the desired gain.

Source follower buffer amplifiers 234 are configured so that an impedance presented by the input of variable amplifier 207 is based upon the impedance presented at the output of source follower buffer amplifiers 234. According to some embodiments, source follower buffer amplifiers 234 are configured so that the impedance presented at their output is effectively many times less than the impedance presented at the input of variable gain amplifier 207. For example, in some embodiments, source follower buffer amplifiers 234 may be configured so that the impedance presented at the input of variable gain amplifier 207 is effectively 1000 or more times greater than the impedance at the output of source follower buffer amplifiers 234. In some embodiments, the impedance at the output of source follower buffer amplifiers 234 is effectively less than 10Ω.

The output of variable gain amplifier 207 ("VOUT") is provided to an analog-to-digital converter (represented here as SDM 250). The analog-to-digital converter is configured to convert the analog output of op-amp 242 into a digital signal according to known means (such as sigma-delta modulation). According to some embodiments, the output of the analog-to-digital converter may be provided to chopping demodulator 251. Chopping demodulator 521 is configured to demodulate the output signal from the analog-to-digital converter according to clock signal 248, as discussed above.

In some embodiments, the digital output of the analog-to-digital converter is provided to a digital signal processor ("DSP") 252. DSP 252 may comprise a processor, a microprocessor, a computer, a storage (such as a RAM, ROM, programmable memory, flash memory, or any combination thereof—to name a few examples), or any combination thereof—to name a few. DSP 252 may be configured to process the digital output of the analog-to-digital converter according to instructions stored in a memory of the DSP 252.

Current channel 222 is configured to monitor the current from line voltage 204, neutral voltage 202, or both. As discussed above with reference to FIGS. 1A and B, a magnetic field sensor comprising one or more magnetic field sensing elements can generate a magnetic field signal representative of the detected magnetic field and thus, representative of the line current. According to some embodiments, the signal representative of the line current may be generated by comparing two or more signals produced from one or more magnetic field sensing elements via differential amplifier 254. Further, the signal representative of the line current may be converted from analog to digital (such as by SDM 256) and be provided to DSP 252.

Figure 3A:
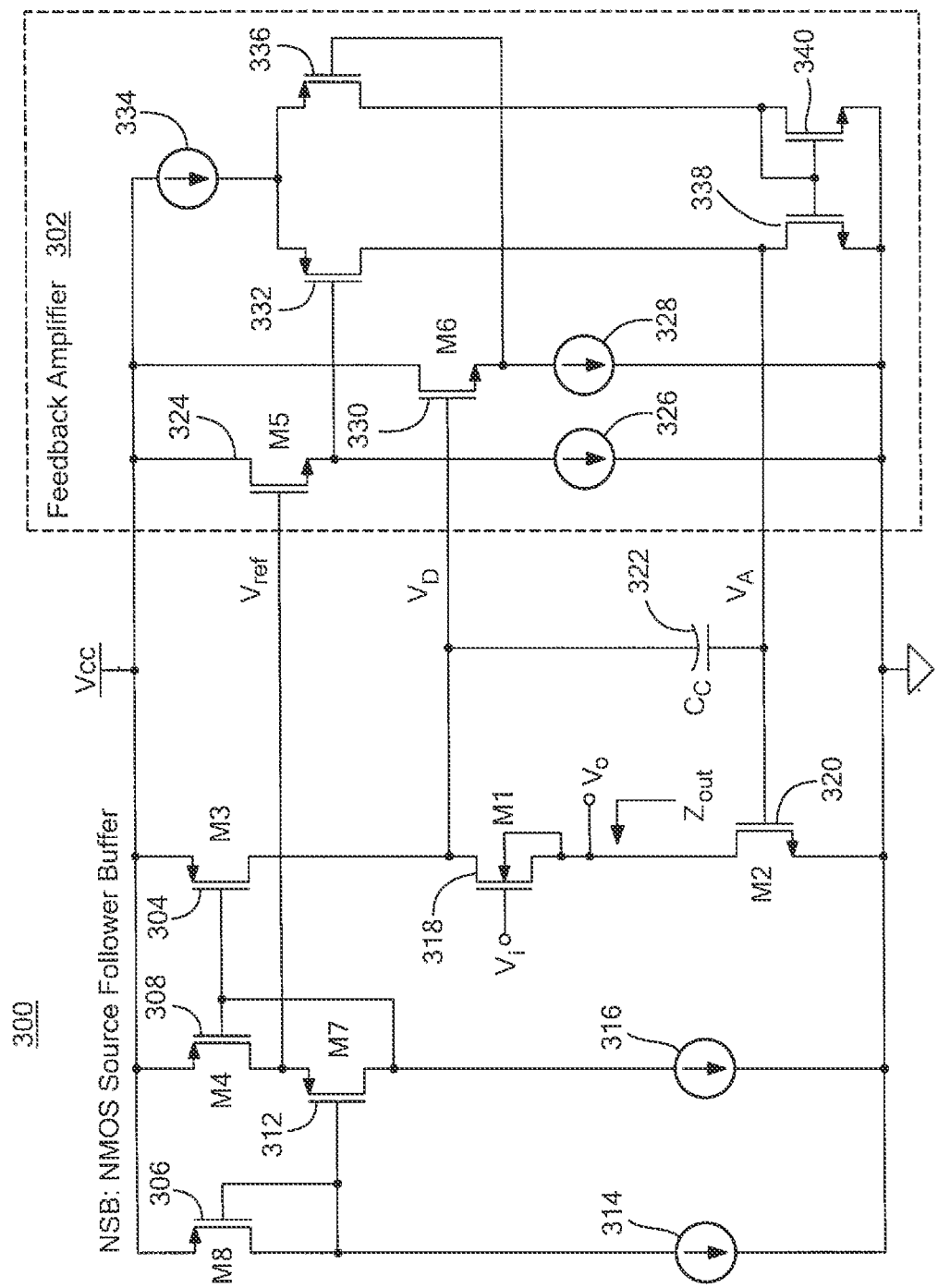
FIG. 3A is a circuit diagram of a source follower buffer amplifier when a common mode voltage is close to a supply voltage, according to some embodiments.
Figure 3B:
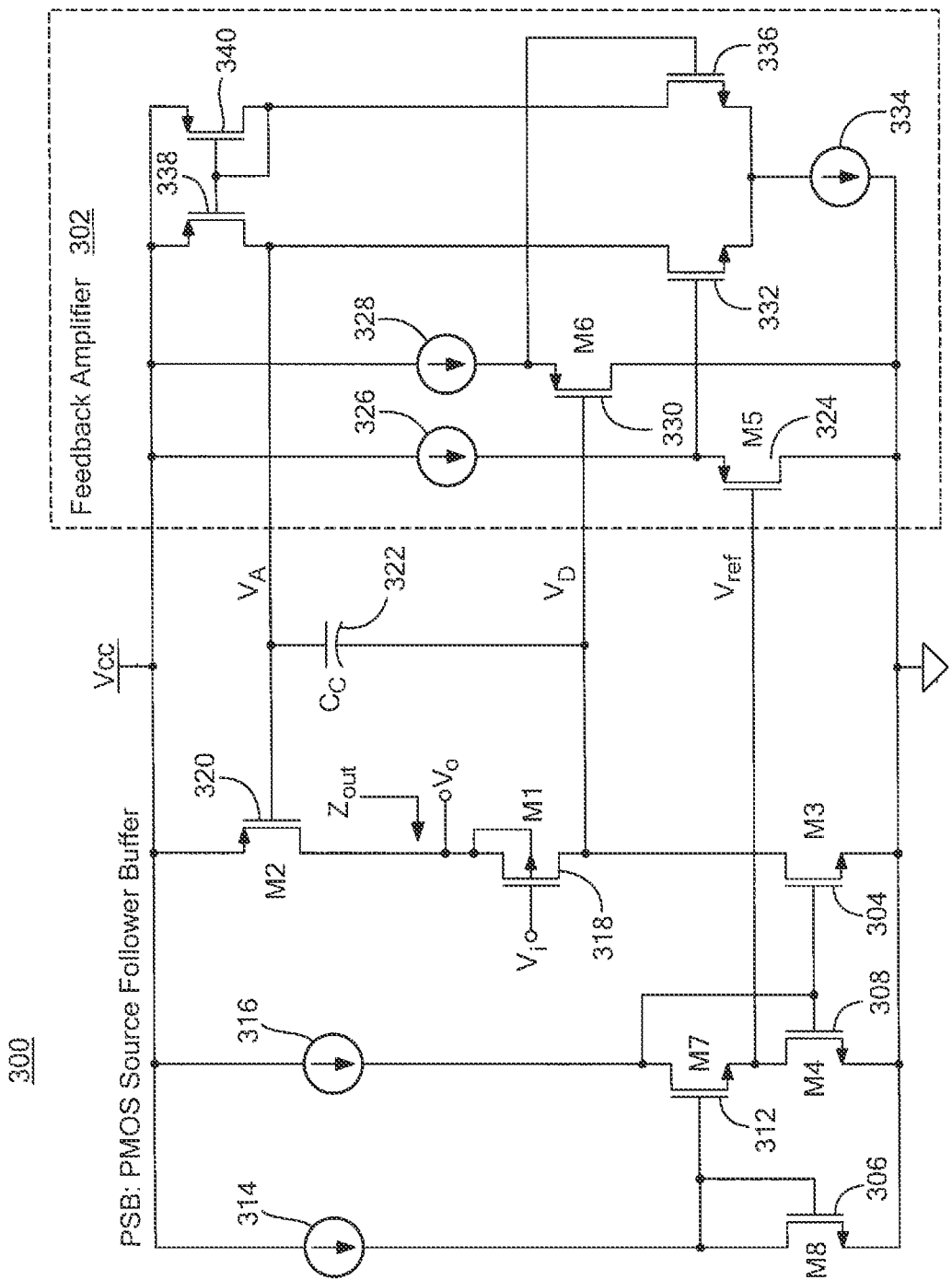
FIG. 3B is a circuit diagram of a source follower buffer amplifier when a common mode voltage is close to a system ground, according to other embodiments.

Referring now to FIGS. 3A and 3B, source follower buffer amplifiers 234 may include at least one source follower buffer amplifier 300. Source follower buffer 300 includes at least one source follower (such as 318), at least one current source (such as 314 or 316), at least one MOSFET (such as 320), and a feedback amplifier 302. In some embodiments, source follower buffer amplifier 300 may be realized in an IC.

FIG. 3A presents an exemplary configuration for source follower buffer amplifier 300 using nMOSFETs as source followers. In the illustrative embodiments of FIG. 3A, a main signal path of source follower buffer amplifier 300 comprises source follower M1 318. Source follower M1 318 may comprise a MOSFET such as a JFET, nMOSFET in enhancement mode, nMOSFET in depletion mode, pMOSFET in enhancement mode, pMOSFET in depletion mode—or any combination thereof—configured as a source follower. In the illustrative embodiment of FIG. 3A, source follower M1 318 is represented as an nMOSFET.

The gate of source follower M1 318 comprises an input of source follower buffer 300 and is tied to an input voltage ("$V_i$") of source follower buffer amplifier 300. According to some embodiments, the input voltage $V_i$ may comprise the output voltage of attenuator 226, as discussed above with reference to FIG. 2. The drain of source follower M1 318 is tied to the drain of MOSFET M3 304 and provides a drain voltage $V_D$, as discussed in further detail below. According to the illustrative embodiment of FIG. 3A, source follower M1 318 may comprise an nMOSFET, providing a high impedance at the input of the source follower buffer amplifier 300 due to the high impedance at the gate of the nMOSFET.

In an embodiment, the gate of source follower M1 318 (i.e. the input of source follower buffer amplifier 300) draws effectively zero current because of the high impedance at the gate of source follower M1 318. This allows the use of simple CMOS switches for chopper stabilization at the input of the source follower buffer amplifier (as, for example, chopper stabilization modulator 232).

In some embodiments, source follower buffer amplifier 300 includes a capacitor $C_c$ 322 coupled between the drain of source follower M1 318 and the gate of MOSFET M2 320. Capacitor $C_c$ will act as a Miller capacitance and is configured to stabilize the feedback amplifier, or control a frequency response, of source follower buffer amplifier 300. The frequency response may be controlled, for example, according to the Miller effect as is known to one of skill in the art.

According to some embodiments, the source of source follower M1 318 comprises the output of source follower buffer amplifier 300. In the illustrative embodiments of FIGS. 3A and 3B, source follower M1 318 is configured to provide an output voltage ("$V_o$") at its source. In some embodiments, $V_o$ is effectively equal to $V_i$ minus the bias voltage of source follower M1 318. In embodiments, output voltage $V_o$ can comprise the input voltage of variable gain amplifier 207, as discussed above with reference to FIG. 2.

The source of source follower M1 318 is further coupled to the drain of MOSFET M2 320. MOSFET M2 320 is configured so that its drain current is controlled by feedback amplifier 302. The drain current of MOSFET M2 320 is controlled by feedback amplifier 302 so that the drain current of source follower M1 318 is equal to the drain current of MOSFET M3 304 even when a load is tied to $V_o$ and drawing current. This allows the drain current of M1 318 to remain substantially constant regardless of a load attached to $V_o$. Further, this configuration allows for $V_i$ to be greater than a supply voltage ("$V_{cc}$") of the source follower buffer amplifier 300.

Feedback amplifier 302 includes a first source follower M5 324, a second source follower M6 330, at least one MOSFET (represented here as MOSFETs 338 and 340), and at least one current source (represented here as current sources 326, 328, and 334). Source followers M5 324 and M6 330 may each comprise a MOSFET such as a JFET, nMOSFET in enhancement mode, nMOSFET in depletion mode, pMOSFET in enhancement mode, pMOSFET in depletion mode—or any combination thereof—configured as a source follower. According to some embodiments, source followers M5 324 and M6 330 are identical.

The circuits including source follower M5 324 and M6 330 function as analog down level shifters or analog up level shifters for the differential voltage pair of the differential amplifier M5 324 and M6 330 are configured to shift the voltages at MOSFETs 332 and 336 so as to avoid turning off the input differential voltage pair. For example, the input differential voltage pair may turn off if the differential voltage pair is directly coupled to $V_{ref}$ and $V_D$, respectfully (i.e. the differential voltage pair is coupled to $V_{ref}$ and $V_D$ and not coupled to the analog level shifters.

The gate of source follower M5 324 is tied to the source of MOSFET M7 312. The source of M7 312 provides a reference voltage ("$V_{ref}$") with MOSFET M4 acting as a biasing transistor for M7 312. The drain of source follower M5 324 is tied to $V_{cc}$ (i.e. the supply voltage to source follower buffer amplifier 300) and the source of source follower M5 324 is tied to both the gate of MOSFET 332 and a current source 326. Current source 326 may comprise a constant current source, a dependent current source, a MOSFET current source, or any combination thereof—to name a few examples.

The gate of source follower M6 330 is tied to the drain of source follower M1 318 and thus drain voltage $V_D$. The drain of source follower M6 330 is tied to $V_{cc}$ and the source of source follower M6 330 is tied to current source 328 and the gate of MOSFET 336. Current source 328 may comprise a constant current source, a dependent current source, a MOSFET current source, or any combination thereof—to name a few examples.

The reference voltage $V_{ref}$ is generated by a bias circuit that is configured so that $V_{ref}$ is very close in value to $V_{cc}$. In the illustrative embodiment, the bias circuit includes MOSFETs M4 308, M7 312, and M8 306 and is configured so that the sources of MOSFETS M4 308 and M8 306 are tied to $V_{cc}$, the gate of MOSFET M8 306 is tied to both the drain of MOSFET M8 306 and the gate of MOSFET M7 312, and the gate of MOSFET M4 308 is tied to the drain of MOSFET M7 312. Further the drain of MOSFET M4 308 is tied to the source of MOSFET M7 312 generating $V_{ref}$. According to some embodiments, $V_{ref}$ is within approximately 300 mV of $V_{cc}$. All components are designed so that Vref is set to a value that keeps M4 in the saturation region.

As discussed above, the drain current of MOSFET M2 320 is controlled by feedback amplifier 302 so that the drain current of source follower M1 318 is equal to the drain current of MOSFET M3 304. Specifically, feedback amplifier 302 is configured to control the drain current of MOSFET M2 320 so that $V_D$ is effectively equal to $V_{ref}$. When $V_D$ is effectively equal to $V_{ref}$, the input voltage $V_i$ can exceed the supply voltage $V_{cc}$ without causing source follower MOSFET M1 to leave the saturation region. Because $V_{ref}$ is chosen to keep MOSFET M4 308 in the saturation region, proper sizing of MOSFET M3 304 and MOSFET M4 308 ensures that MOSFET M3 304 will also operate in the saturation region because it has the same drain voltage as MOSFET M4 308. This configuration forces the drain current of MOSFET M3 304, and hence the drain current of source follower M1 318 to be relatively constant with variations in Vi and with variations in current required by a load connected to $V_o$. According to some embodiments, $V_D$ and $V_{ref}$ are within approximately 100 mV of $V_{cc}$. Feedback amplifier 302 operates to provide a relatively low output impedance of buffer amplifier 300.

Referring now to FIG. 3B, and exemplary embodiment is presented with source follower M1 318 provided as a pMOSFET. Source follower buffer 300 of FIG. 3B is configured to function as source follower buffer 300 presented in FIG. 3A, but with the connections illustrated in FIG. 3B.

Figure 4:
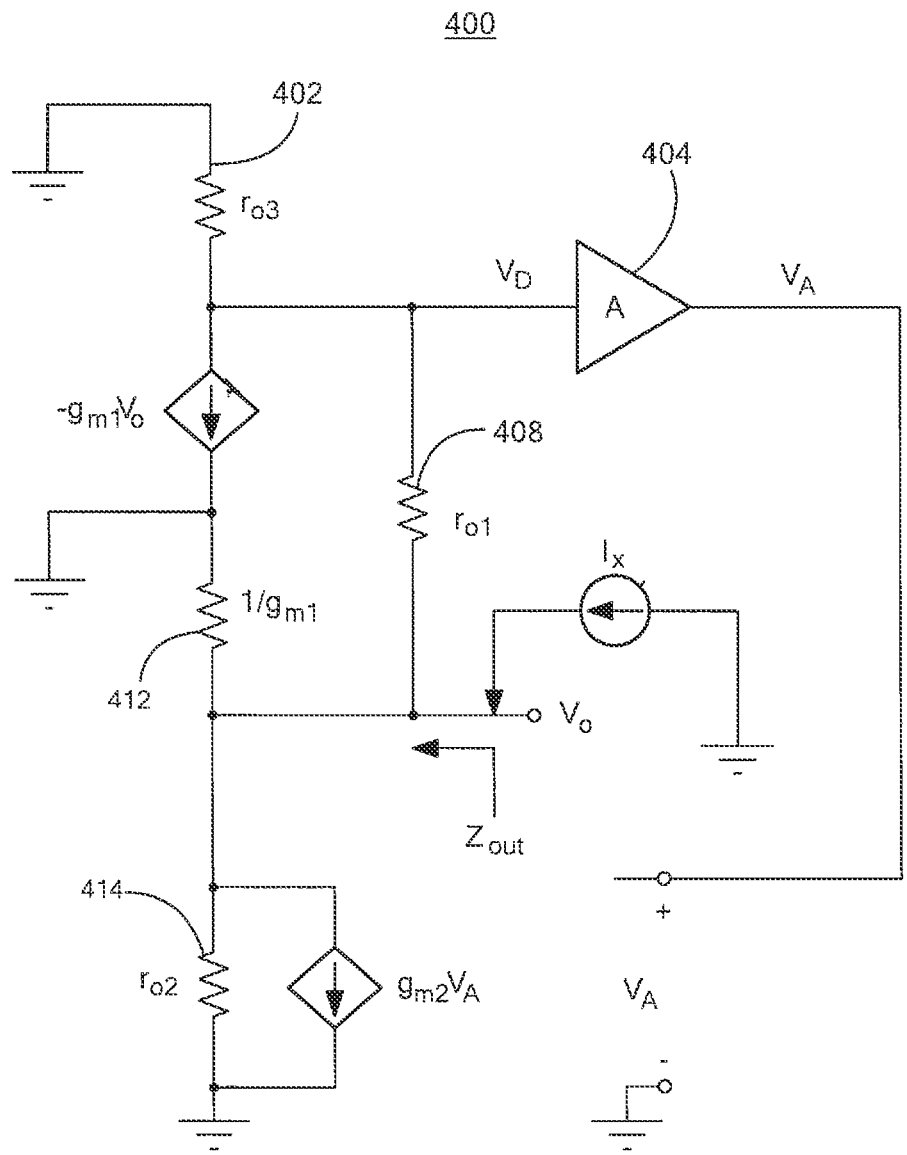
FIG. 4 is small-signal model of a source follower buffer amplifier, according to some embodiments.

FIG. 4 illustrates a small-signal model 400 of source follow buffer amplifier 300, with $V_o$ representing the output voltage of the source follower buffer amplifier and $Z_{out}$ representing the output impedance of the source follower buffer amplifier. From small-signal model 400, one of ordinary skill can determine the effective output impedance ($Z_{out}$) of the source follower buffer amplifier through linear circuit analysis. $Z_{out}$ may be expressed as:

$$Zout \approx \left(\frac{1}{g_{m1}}\right) * 1/(Ag_{m2}(r_{o3} // r_{o1})) \quad \text{[EQ 1]}$$

Wherein $g_{m1}$ represents the transconductance of M1 (318 in FIGS. 3A and 3B), $g_{m2}$ represents the transconductance of M2 (320 in FIGS. 3A and 3B), $r_{o1}$ 408 represents the output impedance of M1 seen at the drain of M1, $r_{o2}$ 414 represents the output impedance of M2, $r_{o3}$ 402 represents output impedance of M3 (304 in FIGS. 3A and 3B), amplifier A 404 represents the DC gain of feedback amplifier 302, and $1/g_{m1}$ 412 represents the output impedance of the source follower M1 318 without the feedback amplifier. Consideration of the above equation reveals that the source follower output impedance $1/g_{m1}$ is attenuated by the factor A $g_{m2}$ ($r_{o3}/r_{o1}$), which is the loop gain of the feedback amplifier. The following table illustrates an example embodiment for a source follower buffer with an NMOS source follower output impedance without feedback control being 6.62 kΩ, and an output impedance of 2.9Ω with feedback control.

TABLE 1

| Parameter | Typical Value |
| --- | --- |
| $g_{m1}$: Transconductance of M1 | 151 µS |
| $g_{m2}$: Transconductance of M2 | 226 µS |
| $r_{o1}$: Output impedance of M1 | 3.123 MΩ |
| $r_{o2}$: Output impedance of M2 | 834 kΩ |
| $r_{o3}$: Output impedance of M3 | 114 kΩ |
| A: DC gain of feedback amplifier | 92 |
| $1/g_{m1}$: Output impedance without feedback amplifier | 6.62 kΩ |
| A $g_{m2}$ ($r_{o3}//r_{o1}$) | 2287 |
| $Z_{out}$: Overall output impedance | 2.9 Ω |

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

The invention claimed is:

1. Apparatus, comprising:
a buffer amplifier comprising a source follower and a feedback amplifier, the feedback amplifier configured to control a drain current of the source follower to remain substantially constant independent of a load, wherein the buffer amplifier is coupled to an input voltage based upon a line voltage and to a supply voltage derived from the input voltage.

2. The apparatus of claim 1, wherein the buffer amplifier presents an output impedance based upon the feedback amplifier.

3. The apparatus of claim 1, wherein the buffer amplifier further comprises a plurality of MOSFETs, wherein at least one of the plurality of MOSFETs is coupled to the source follower and wherein the feedback amplifier is configured to control the drain current of the source follower to match a drain current of the at least one of the plurality of MOSFETs.

4. The apparatus of claim 1, wherein the feedback amplifier is further configured to control a voltage of a drain of the source follower.

5. The apparatus of claim 4, wherein the controlled voltage of the drain of the source follower is within approximately 300 mV of the supply voltage.

6. The apparatus of claim 1, wherein a common mode voltage associated with the input voltage is greater than the supply voltage.

7. The apparatus of claim 1, wherein a common mode voltage associated with the input voltage is within approximately 300 mV of the supply voltage.

8. The apparatus of claim 1, further comprising an attenuator coupled to an input of the buffer amplifier, wherein the attenuator comprises at least one resistor.

9. The apparatus of claim 8, wherein an input impedance presented by the buffer amplifier is effectively 1000 times greater than an output impedance presented by the attenuator.

10. The apparatus of claim 1, wherein an output of the source follower of the buffer amplifier is coupled to a variable gain amplifier.

11. The apparatus of claim 10, wherein an impedance presented by an input of the variable gain amplifier is effectively 1000 times greater than an output impedance presented by the buffer amplifier.

12. The apparatus of claim 1, wherein the buffer amplifier is realized in an integrated circuit.

13. The apparatus of claim 1, wherein the feedback amplifier comprises a MOSFET coupled to a source of the source follower of the buffer amplifier.

14. The apparatus of claim 13, further comprising a capacitor coupled between a drain of the source follower and a gate of the MOSFET, wherein the capacitor is configured to control a frequency response of the buffer amplifier.

15. The apparatus of claim 1, wherein the feedback amplifier comprises at least two source followers.

16. The apparatus of claim 15, wherein a gate of a first source follower of the feedback amplifier is coupled to a reference voltage, and a gate of a second source follower of the feedback amplifier is coupled to a drain voltage of the source follower of the buffer amplifier.

17. The apparatus of claim 16, wherein the drain voltage is within approximately 100 mV of the reference voltage.

18. The apparatus of claim 16, wherein the first and second source followers of the feedback amplifier are coupled to a differential amplifier.

19. The apparatus of claim 18, wherein the first and second source followers of the feedback amplifier are configured to shift at least one voltage of a differential pair at an input of the differential amplifier so that a voltage of the differential pair is in an operating region of the differential amplifier.

20. A power monitoring circuit to monitor a line voltage associated with a power source, comprising:
a buffer amplifier comprising a source follower and a feedback amplifier, the feedback amplifier configured to control a drain current of the source follower to remain substantially constant independent of a load; and
a chopper circuit coupled to an input of the buffer amplifier.

21. The power monitoring circuit of claim 20, wherein the buffer amplifier is coupled to an input voltage derived from the line voltage and to a supply voltage derived from the line voltage.

22. The power monitoring circuit of claim 21, wherein a common mode voltage associated with the input voltage is greater than the supply voltage.

23. The power monitoring circuit of claim 21, wherein a common mode voltage associated with the input voltage is within approximately 300 mV of the supply voltage.

24. The power monitoring circuit of claim 21, wherein the supply voltage is an AC voltage.

25. The power monitoring circuit of claim 21, wherein the supply voltage is a DC voltage.

26. The power monitoring circuit of claim 20, wherein an input impedance presented by the buffer amplifier is effectively greater than 100 MOhms.

27. The power monitoring circuit of claim 20, wherein an output impedance presented by the buffer amplifier is effectively less than 100Ω.

28. The power monitoring circuit of claim 20, further comprising a variable gain amplifier coupled to an output of the buffer amplifier.

29. The power monitoring circuit of claim 28, wherein an output of the variable gain amplifier is coupled to an analog-to-digital converter.

30. The power monitoring circuit of claim 29, wherein the analog-to-digital converter comprises a sigma-delta modulator.

31. The power monitoring circuit of claim 29, wherein an output of the analog-to-digital converter is coupled to a digital signal processor.

32. The power monitoring circuit of claim 20, wherein the power monitoring circuit is realized in an integrated circuit.

33. Apparatus comprising:
means for controlling a drain current of a source follower in a buffer amplifier to remain substantially constant independent of a load, wherein the buffer amplifier is coupled to an input voltage based upon a line voltage and to a supply voltage derived from the input voltage; and
means for controlling an output impedance of the buffer amplifier.

34. The apparatus of claim 33, further comprising:
means for controlling the drain current of the source follower to match a drain current of at least one of a plurality of MOSFETs in the buffer amplifier.

35. The apparatus of claim 33, further comprising:
means for controlling a voltage at a drain of the source follower.

36. The apparatus of claim 33, further comprising:
means for shifting an output voltage of the buffer amplifier.

37. The apparatus of claim 33, further comprising:
means for controlling a capacitance of the source follower.

* * * * *

UNITED STATES PATENT AND TRADEMARK OFFICE
CERTIFICATE OF CORRECTION

PATENT NO.         : 10,644,659 B2
APPLICATION NO.    : 16/111679
DATED              : May 5, 2020
INVENTOR(S)        : Soo-Chang Choe et al.

It is certified that error appears in the above-identified patent and that said Letters Patent is hereby corrected as shown below:

In the Specification

Column 3, Line 15 delete "FIG. 4 is small-signal" and replace with --FIG. 4 is a small-signal--.

Column 4, Line 12 delete "digital." and replace with --digital circuit.--.

Column 5, Line 35-36 delete "ground on-site power ground local" and replace with --ground, on-site power ground, local--.

Column 6, Line 38-39 delete "FIGS. 1A and B," and replace with --FIGS. 1A and 1B,--.

Column 6, Line 46 delete "of the of" and replace with --of the--.

Column 8, Line 27 delete "and that" and replace with --that--.

Column 8, Line 32 delete "FIGS. 1A and B)." and replace with --FIGS. 1A and 1B).--.

Column 8, Line 35 delete "FIGS. 1A and B." and replace with --FIGS. 1A and 1B.--.

Column 8, Line 45 delete ". Likewise, at the" and replace with --. Likewise, the--.

Column 9, Line 5 delete "FIGS. 3A and B)." and replace with --FIGS. 3A and 3B).--.

Column 9, Line 39 delete "suppled" and replace with --supplied--.

Column 10, Line 17 delete "FIGS. 1A and B," and replace with --FIGS. 1A and 1B,--.

Column 11, Line 42 delete "follower" and replace with --followers--.

Column 11, Line 45 delete "amplifier" and replace with --amplifier.--.

Signed and Sealed this
Seventeenth Day of November, 2020

Andrei Iancu
*Director of the United States Patent and Trademark Office*

Column 11, Line 51 delete "shifters." and replace with --shifters).--.

Column 12, Line 33 delete "Vi" and replace with --$V_i$--.

Column 12, Line 38 delete ", and" and replace with --, an--.

Column 12, Line 44 delete "follow" and replace with --follower--.

Column 12, Line 67 delete "($r_{o3}/r_{o1}$)," and replace with --($r_{o3}//r_{o1}$),--.